(12) United States Patent
Isobe et al.

(10) Patent No.: US 7,868,544 B2
(45) Date of Patent: *Jan. 11, 2011

(54) DISPLAY APPARATUS

(75) Inventors: Ryuichiro Isobe, Kawasaki (JP); Hideo Mori, Yokohama (JP); Osamu Yuuki, Tokyo (JP); Tatsuyuki Tokunaga, Saitama (JP); Hidemasa Mizutani, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

This patent is subject to a terminal disclaimer.

(21) Appl. No.: 12/424,656

(22) Filed: Apr. 16, 2009

(65) Prior Publication Data

US 2009/0200934 A1 Aug. 13, 2009

Related U.S. Application Data

(62) Division of application No. 11/551,380, filed on Oct. 20, 2006, now Pat. No. 7,541,739.

(30) Foreign Application Priority Data

Dec. 14, 2005 (JP) ............................. 2005-360026
Oct. 6, 2006 (JP) ............................. 2006-274574

(51) Int. Cl.
*H01J 1/62* (2006.01)
(52) U.S. Cl. ...................... 313/506; 313/504
(58) Field of Classification Search ................ 313/461, 313/473, 477 R, 506, 512
See application file for complete search history.

(56) References Cited

U.S. PATENT DOCUMENTS

| 5,912,654 | A | 6/1999 | Ouchi et al. ................... 345/98 |
| 6,020,867 | A | 2/2000 | Shimada et al. ............... 345/87 |
| 7,252,879 | B2 | 8/2007 | Iwanaga ...................... 428/336 |
| 2007/0126692 | A1 | 6/2007 | Ito et al. ...................... 345/107 |
| 2007/0145889 | A1 | 6/2007 | Tamura et al. ............... 313/504 |
| 2007/0159093 | A1 | 7/2007 | Yuki et al. ................... 313/512 |

FOREIGN PATENT DOCUMENTS

| JP | 9-127885 | 5/1997 |
| JP | 10-068816 | 3/1998 |

*Primary Examiner*—Vip Patel
(74) *Attorney, Agent, or Firm*—Fitzpatrick, Cella, Harper & Scinto

(57) ABSTRACT

Provided is a display apparatus capable of reducing external light reflection to reduce an amount of glare of the outside, in which a translucent protection member is provided to cover an observation surface side of a display member including an organic EL light-emitting portion, in order to protect the display member. The display apparatus includes the display member with an organic EL light-emitting portion having a pair of electrodes and an organic compound layer provided between the pair of electrodes; and a casing for housing the display member, wherein a protection member is provided in the casing with a gap from the display member, and wherein a phase member and a polarizing member are formed on the protection member such that the polarizing member is located closer to a light extraction side than the phase member.

8 Claims, 5 Drawing Sheets

DISPLAY APPARATUS

This application is a divisional of application Ser. No. 11/551,380, filed on Oct. 20, 2006, now allowed.

BACKGROUND OF THE INVENTION

1. Field of the Invention

The present invention relates to a display apparatus including an organic electroluminescent (EL) light-emitting portion which has a pair of electrodes and an organic compound layer provided between the pair of electrodes.

2. Description of the Related Art

An organic EL device is attracting attention for a self light-emitting display panel. The organic EL device includes a light-emitting layer for emitting light energy to each of an observation surface side and a non-observation surface side of a display panel. In order to effectively use the light energy emitted to the non-observation surface side, of electrodes for injecting charges to the light-emitting layer, an electrode located on the non-observation surface side is normally provided with a reflection function to reflect light emitted to the non-observation surface side toward the observation surface side. Therefore, the light energy extracted from the observation surface side can be increased.

However, when the electrode located on the non-observation surface side is provided with the reflection function to use as a reflection electrode, a phenomenon occurs in which light incident on the organic EL device from the outside is reflected on the reflection electrode and then exits to the outside of the organic EL device again. In recent years, a display panel including the organic EL device, which is incorporated in a digital still camera, a mobile telephone, or the like has been used outdoors more often. When a reflection phenomenon is caused by the reflection electrode, it is visually recognized as an external glare phenomenon at the time of actual use, and the phenomenon significantly deteriorates the image quality of the display panel. This is recognized as a problem specific to the display panel using the organic EL device.

Japanese Patent Application Laid-Open No. H09-127885 discloses that a plurality of phase difference compensation films and a polarizing plate are combined as means for suppressing external light reflection, thereby reducing an amount of reflected light in a wide wavelength range.

Japanese Patent Application Laid-Open No. H10-068816 discloses a circular polarizing plate obtained by combining a ¼-phase difference compensation film, a ½-phase difference compensation film, and a linear polarizing plate.

As described above, a display member using the organic EL device (i.e., organic EL light-emitting portion) is incorporated in a casing for a digital still camera, a digital video camera, or the like to be visually recognizable. Therefore, a load such as a pressure or a shock from the outside is easily applied to the display member. In addition, the organic EL device is composed of a stacked thin film including an organic compound layer. Therefore, the organic EL device is affected by the pressure and shock from the outside, so that it is likely to cause a break of a boundary of the organic compound layer or a short circuit between the electrodes by the loads, whereby the organic EL device is not turned on with a possibility. Thus, in order to protect the display member, a translucent protection member is located so as to cover the observation surface side of the display member.

However, in order to reduce the loads from the outside, the protection member is normally separated from the display member with a gap therebetween. Therefore, light is reflected at an interface between each of the members and the gap, with the result that it is likely to increase the amount of glare by external light reflection at the time of outdoor use.

SUMMARY OF THE INVENTION

An object of the present invention is to provide a display apparatus capable of reducing external light reflection to reduce the amount of glare of the outside, in which a translucent protection member is provided so as to cover an observation surface side of a display member including an organic EL light-emitting portion in order to protect the display member.

In order to solve the above-mentioned problem, according to one aspect of the present invention, there is provided a display apparatus including: a display member including an organic EL light-emitting portion having a pair of electrodes and an organic compound layer provided between the pair of electrodes, and a casing for housing the display member, wherein a protection member is provided in the casing and is separated with a gap from the display member, and wherein a phase member and a polarizing member are formed on the protection member such that the polarizing member is provided closer to a light extraction side than the phase member.

Further, according to another aspect of the present invention, there is provided a display apparatus including: a display member including an organic EL light-emitting portion having a pair of electrodes and an organic compound layer provided between the pair of electrodes, and a casing for housing the display member, wherein a protection member is provided on a light extraction side of the display member and separated with a gap from the display member, wherein a structure including the protection member and the display member is provided in the casing, wherein a phase member and a polarizing member are formed on the protection member such that the polarizing member is located closer to a light extraction side than the phase member.

According to the present invention, in order to protect the display member including the organic EL light-emitting portion, the phase member and the polarizing member are formed on the translucent protection member separated with the gap from the display member so as to cover the observation surface side of the display member. Therefore, light beams reflected at an interface between the display member or the protection member and the gap and reflected on the electrode, which has a reflection function, of the organic EL light-emitting portion included in the display member are blocked by the phase member and the polarizing member, whereby the amount of glare of the outside world can be reduced.

Further features of the present invention will become apparent from the following description of exemplary embodiments with reference to the attached drawings.

DESCRIPTION OF THE EMBODIMENTS

Hereinafter, embodiments for embodying the present invention will be described with reference to the attached drawings. However, the present invention is not limited to the embodiments of the present invention described below.

Figure 1A:
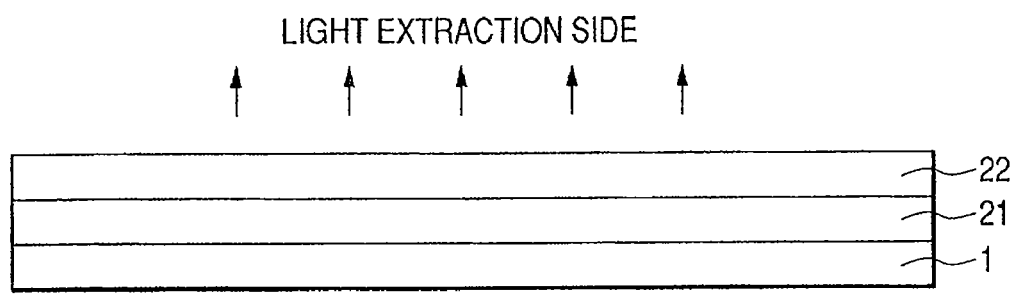
FIGS. 1A and 1B are schematic cross sectional views showing a protection member and a display member in an embodiment of the present invention, respectively.
Figure 1B:
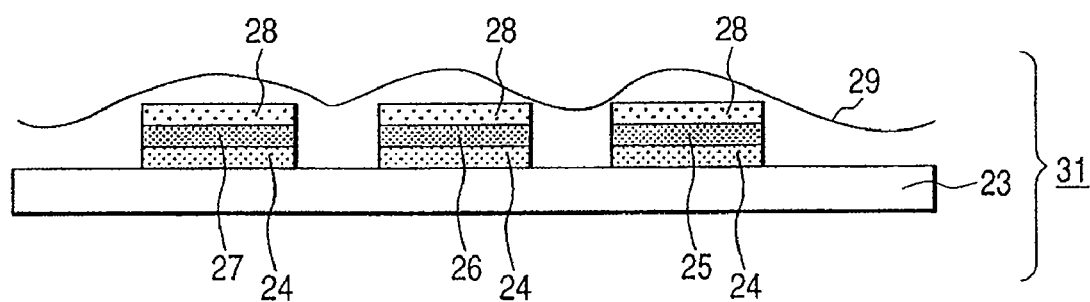

FIGS. 1A and 1B are schematic cross sectional views showing a protection member and a display member in the embodiment of the present invention. In FIGS. 1A and 1B, reference numeral 1 denotes the protection member, 21 a phase member, 22 a polarizing member, 23 a substrate, 24 reflection electrodes, 25, 26 and 27 organic compound layers, 28 transparent electrodes, 29 a protection film, and 31 the display member.

The display member in this embodiment includes a plurality of organic EL light-emitting portions formed on the substrate 23. In each of the organic EL light-emitting portions, the organic compound layer 25, 26 or 27 including at least a light-emitting layer is provided between the reflection electrode 24 and the transparent electrode 28 which are opposed to each other. An electrical connection is made such that one of the reflection electrode 24 and the transparent electrode 28 is a cathode and the other thereof is an anode.

A hard substrate made of glass, silicon, stainless steel (SUS), or the like, or a soft substrate made of plastic, epoxy, or the like can be used as the substrate 23. For example, a 1737 substrate produced by Corning Inc. is used as a glass substrate.

Thin film transistor (TFT) elements (not shown) and wiring structures for controlling the switching of the TFT elements are formed in matrix on the substrate 23. The reflection electrodes 24 having a reflection function are formed over the TFT elements and the wiring structures and electrically connected therewith. A metal material having a high reflectance such as Cr or Al can be used for the reflection electrodes 24. In this case, for example, the metal material is deposited on the substrate 23 by a sputtering method, and patterning of the deposited metal material is performed by a photolithography method, whereby the reflection electrodes 24 can be formed. A transparent electrode made of indium tin oxide (ITO), indium zinc oxide (IZO), or the like may be formed on the deposited metal material to produce a stacked electrode structure and use the stacked electrode structure as the reflection electrodes 24. A transparent layer obtained by depositing silicon oxynitride by a sputtering method may be provided between the metal material and the transparent electrode, and the metal material and the transparent electrode may be electrically connected with each other through contact holes provided in the transparent layer to form the reflection electrodes 24.

The organic compound layers 25, 26 and 27 corresponding to respective colors of red (R), green (G) and blue (B) are formed on the reflection electrodes 24. It is only necessary that each of the organic compound layers 25, 26 and 27 has at least a light-emitting layer. Examples of a layer structure of the organic compound layer include a structure in which a hole transport layer, a light-emitting layer, and an electron transport layer are stacked, or a structure in which a hole injection layer, a hole transport layer, a light-emitting layer, an electron transport layer, and an electron injection layer are stacked. The layer structure of the organic compound layers in the present invention is not limited to these structures and thus other layer structures may be employed.

The film thicknesses of the organic compound layers may be set to different film thicknesses for emitting respective colors according to a dominant wavelength of emitted light. For example, the film thickness may be set such that an optical path length between a light emission position and the reflection electrode 24 may be set to a ¼ wavelength or a ¾ wavelength.

When a load such as a pressure or a shock is applied to the organic EL light-emitting portion, in order to avoid the breaking of a boundary of the organic compound layer to prevent the organic EL light-emitting portion from being not turned on. In order to prevent such the case from occurring, it is preferable to stack a plurality of organic compound layers 25, 26 and 27 between the reflection electrode 24 and the transparent electrode 28. Even in this case, it is preferable that a distance between the reflection electrode 24 and the transparent electrode 28 in the organic EL light-emitting portion be set to 10 nm or more and 1 μm or less.

In order to separate the organic compound layers 25, 26 and 27 from one another in a surface direction of the substrate 23, a pixel isolation film made of silicon nitride, a polyimide resin, a novolak resin, or the like may be provided.

The transparent electrodes 28 are formed on the organic compound layers 25, 26 and 27. Each of the transparent electrodes 28 is formed by, for example, stacking films of ITO using a sputtering method. IZO (i.e., compound of zinc oxide and indium oxide) may be used instead of ITO.

According to the above-mentioned structure, the plurality of organic EL light-emitting portions are formed on the substrate 23. In each organic EL light-emitting portion, voltage is applied or current is allowed to flow between the reflection electrode 24 and transparent electrode 28 through the TFT element formed in matrix on the substrate 23.

In order to prevent the characteristics of the organic EL light-emitting portions from deteriorating due to moisture, it is preferable that the entire display member be sealed with the protection film 29 so as to cover the plurality of organic EL light-emitting portions formed on the substrate 23. A silicon nitride film or a silicon oxynitride film may be used as a material for the protection film 29. Alternatively, a glass substrate may be bonded as the protection film 29 to the substrate 23. The protection film 29 is a member which is located over the substrate 23 to prevent the plurality of organic EL light-emitting portions formed on the substrate 23 from being exposed to air, and is different from the protection member 1 provided to be exposed from the casing as described later. Therefore, the protection film 29 is not necessarily provided in the present invention.

The display member 31 is located in a casing 30 for housing the display member 31 and specifying the outline of a display apparatus to be visually recognizable from the outside. In order to protect the display member 31, the translucent protection member 1 is separated with a gap therebetween so as to cover an observation surface side (i.e., light extraction surface side) of the display member 31 (see FIGS. 2 to 4).

Figure 2:
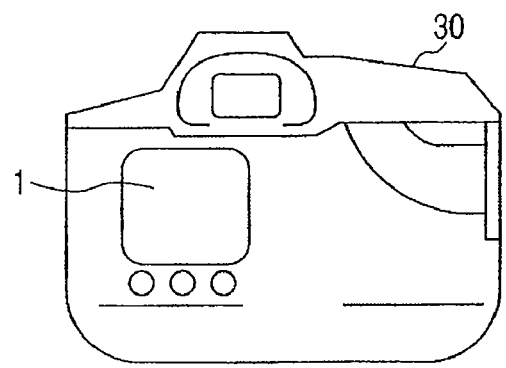
FIG. 2 is a schematic view showing an example of a digital single-lens reflex camera as a display apparatus according to the embodiment of the present invention.
Figure 3:
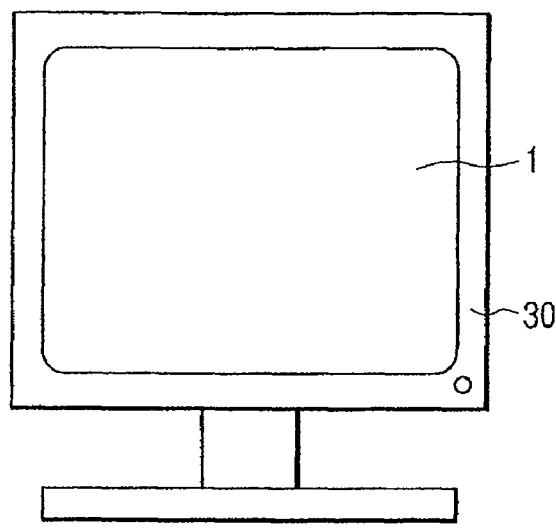
FIG. 3 is a schematic view showing an example of an EL display as the display apparatus according to the embodiment of the present invention.

The casing 30 described here corresponds to a casing for housing the display member including the organic EL light-emitting portions and specifying the outline of the display apparatus as in the case of an image pickup apparatus including an image pickup means, such as a digital still camera or a digital video camera, a mobile telephone, a television receiver, or the like. FIGS. 2 and 3 are schematic views showing examples of the display apparatus according to this embodiment. FIG. 2 shows a rear surface of a digital single-lens reflex camera which is the image pickup apparatus including the image pickup means. The protection member 1 is provided to be exposed from the casing 30 of the digital single-lens reflex camera. FIG. 3 shows a front surface of an EL display. The protection member 1 is provided so as to be exposed from the casing 30 of the EL display.

The protection member 1 is a translucent member and formed of, for example, a transparent material. Glass, a polycarbonate material, an acrylic material, or the like can be used as a material of the protection member 1.

Figure 4:
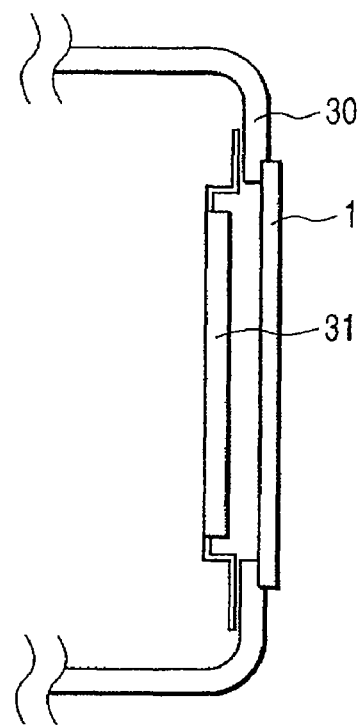
FIG. 4 is a schematic cross sectional view showing the display member and the protection member which are located in a casing.

The phase member 21 and the polarizing member 22 are formed on the protection member 1. As shown in FIG. 4, the protection member 1 described here is a member which is provided on the casing 30 in order to protect the display member 31 located in an inner portion of the casing 30 from a load such as a pressure or a shock from the outside.

An adhesive layer (not shown) may be provided between the protection member 1 and the phase member 21, and between the phase member 21 and the polarizing member 22 to bond the respective members to one another, thereby stacking the members.

Figure 5A:
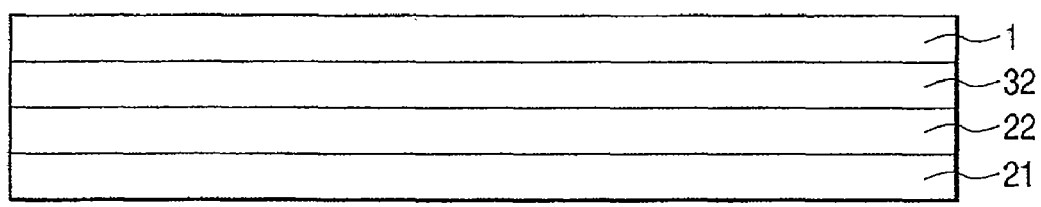
FIGS. 5A and 5B are schematic cross sectional views showing the protection member as a modified example and the display member in the embodiment of the present invention, respectively.
Figure 5B:
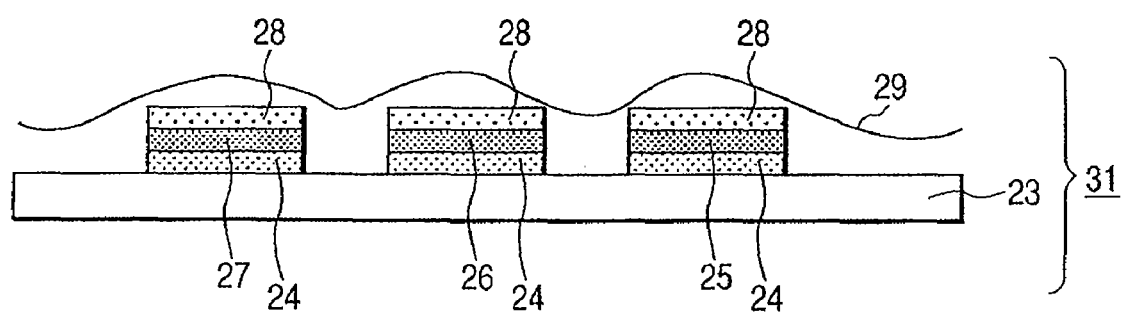

With respect to the arrangement among the protection member 1, the phase member 21 and the polarizing member 22, the polarizing member 22, the phase member 21 and the protection member 1 are arranged in the stated order from the light extraction side (i.e., observation surface side) in FIG. 1A. However, the present invention is not limited to such the arrangement. The protection member 1, the polarizing member 22 and the phase member 21 may be arranged in the stated order from the light extraction side. Alternatively, the polarizing member 22, the protection member 1 and the phase member 21 may be arranged in the stated order from the light extraction side. In other words, in any case, the phase member 21 and the polarizing member 22 are formed such that the polarizing member 22 is provided closer to the light extraction side than the phase member 21. When the protection member 1, the polarizing member 22 and the phase member 21 are formed in the stated order from the light extraction side, an adhesive layer 32 may be provided between the polarizing member 22 and the protection member 1 as shown in FIG. 5A. In this case, when a refractive index of the adhesive layer 32 is a numerical value between a refractive index of the polarizing member 22 and a refractive index of the protection member 1, external light reflection can be further reduced.

A material of an adhesive layer 32 is not particularly limited. A polyvinyl alcohol resin-based adhesive, an acrylic resin-based adhesive, a polyester resin-based adhesive, a urethane resin-based adhesive, a polyether resin-based adhesive, or a rubber-based adhesive may be used.

When the polarizing member 22 is to be located closest to the light extraction side, it is preferable to use a material having no birefringence as a material of the protection member 1. A surface of the polarizing member 22 which is located closest to the light extraction side or a surface of the protection member 1 which is located closest to the light extraction side may be subjected to antireflection processing. When the polarizing member 22 is located closest to the light extraction side, the influence of reflection caused at portions located between the protection member 1 and the substrate 23 can be reduced.

A polycarbonate-based material, a norbornene-based material or the like can be used as a material of the phase member 21. The phase member 21 is preferably a film. It is preferable that the phase member 21 be a phase member having at least a phase difference close to ¼ of 550 nm which is near the peak of the relative spectral sensitivity curve of a human. In this case, it is preferable to set an optical axis angle between the phase member 21 and the polarizing member 22 to 45 degrees. In order to maintain preferable phase compensation characteristics, the phase member 21 may be composed of a plurality of stacked phase members as described in Japanese Patent Application Laid-Open No. H10-068816. When the plurality of phase members are used, an optical axis angle between the polarizing member 22 and each of the films composing the phase member 21 is not necessarily limited to a numerical value of 45 degrees as described above. Therefore, it is only necessary that each optical axis angle be set to an angle corresponding to a phase difference. For example, a phase member having a ½-phase difference and tilted at 15 degrees relative to the polarizing member 22 may be provided under the polarizing member 22. In addition, a phase member having a ¼-phase difference and an optical axis tilted at 75 degrees relative to an optical axis of the polarizing member 22 may be provided on the display member side (i.e., non-observation surface side) under the phase member having the ½-phase difference. In this case, external light reflection in a wider wavelength range can be reduced as compared with the case where only a single phase member is used.

As shown in FIG. 4, the protection member 1 is separated from the display member 31 including the organic EL light-emitting portions with a predetermined gap therebetween. A gas or a vacuum may be present in the gap. The gas present in the gap may be air, or the gap may be filled with another gas. The another gas is an inert gas such as $N_2$ or Ar. Even when a load is applied to the protection member 1 to elastically deform the protection member 1, it is suitable that the gap between the display member 31 and the protection member 1 have a distance at which the protection member 1 is not brought into contact with the display member 31, that is, the distance is preferably 1 mm or more and 10 mm or less.

In FIG. 4, according to a method of locating the protection member 1 and the display member 31, the protection member 1 and the display member 31 are located in and on the casing 30 in which the display member 31 is to be located, respectively. However, the present invention is not limited to such the location. When the protection member 1 is provided on the display member 31 and separated with a predetermined gap therefrom, a structure including the protection member 1 and the display member 31 may be provided in or on the casing 30. In this case, when the display member 31 is directly provided in the casing 30, the protection member 1 may be provided on the display member 31 to indirectly locate the protection member 1 to the casing 30.

Next, an operation of the display apparatus according to this embodiment will be described.

Figure 6:
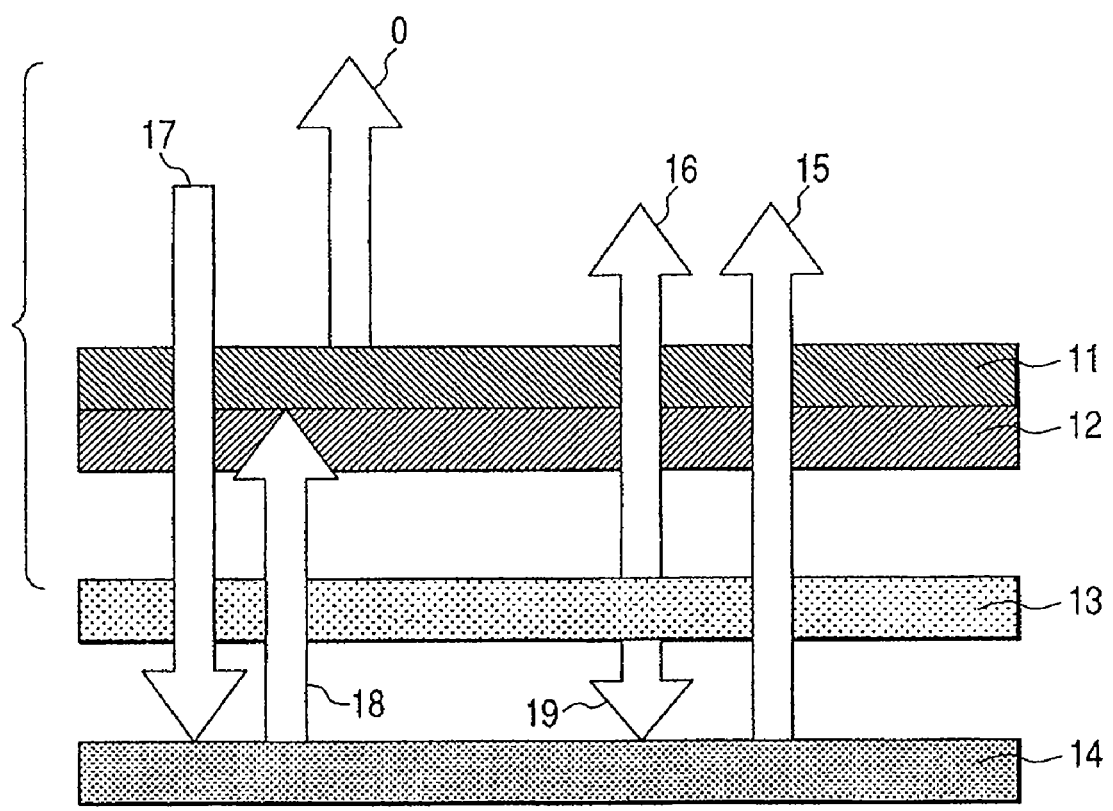
FIG. 6 is an explanatory view showing a principle for reducing reflected light at the display member by the phase member and the polarizing layer.

First, a principle for reducing the amount of reflected light in the display apparatus by a phase member and a polarizing layer in a comparative example of the display apparatus according to the present invention will be described with reference to FIG. 6. For convenience of explanation with respect to light, FIG. 6 shows a state where there are gaps between a phase member 12 and a light-emitting layer 13, and between the light-emitting layer 13 and a reflection layer 14. However, actually gaps are absent and contact states are present.

The display member is composed of the reflection layer 14, the light-emitting layer 13, the phase member 12, and a polarizing layer 11, all of which are stacked.

The polarizing layer 11 is a layer for transmitting only one of a p-wave and an s-wave of incident light. The phase member 12 includes a plurality of stacked phase difference films and has a phase difference of a ¼ wavelength in a wide wavelength range. That is, a phase of the p-wave or the s-wave of light passing through the polarizing layer 11 and the phase member 12 is shifted by a ¼ wavelength in a wide wavelength range, so that the light is converted into circularly polarized light.

Light 16 emitted from the light-emitting layer 13 toward the polarizing layer 11 passes through the polarizing layer 11 and exits to the outside of the display member. On the other hand, light 19 emitted toward the reflection layer 14 is reflected on the reflection layer 14. The reflected light 15 passes through the light-emitting layer 13, the phase member 12, and the polarizing layer 11 and exits to the outside of the display member. As described above, both the light 16 and the light 19 which are emitted from the light-emitting layer 13 exit to the outside of the display member.

However, with respect to each of the light 16 and the light 19, only one of linearly polarized components passes through the polarizing layer 11, so that light intensity reduces.

A part of incident light 17 from the outside of the display member becomes reflected light 0 on a surface of the polarizing layer 11. Of the incident light 17, light which is not reflected on the polarizing layer 11 is converted into circularly polarized light by the polarizing layer 11 and the phase member 12 to be reflected on the reflection layer 14. When the incident light 17 is reflected on the reflection layer 14, a phase thereof is shifted by a half wavelength. Therefore, light 18 passing through the phase member 12 cannot pass through the polarizing layer 11.

According to the above-mentioned principle, reflected light of external light reflected on the reflection layer 14 becomes only the reflected light 0 reflected on the surface of the polarizing layer 11. Therefore, the amount of reflected light can be reduced by only the display member.

However, as shown in FIGS. 2 and 4, for example, when the display member is to be incorporated in the casing of the digital single-lens reflex camera, in order to protect the display member, the translucent protection member is provided and separated from the display member with a gap therebetween so as to cover the observation surface side of the display member. In this embodiment, the gap between the protection member 1 and the display member is set to a distance of 1 mm or more and 10 mm or less. That is, a user of the display apparatus according to this embodiment observes the display member 31 located in the inner portion of the casing 30 through the translucent protection member 1. As described above, the protection member 1 is exposed to the outside and has a function of preventing load such as a pressure or a shock from the outside from being applied to the display member 31.

Depending on a use mode, in order to protect the surface of the display member 31, a protection film such as a polymer film, a passivation film, or a cover glass may be provided on the surface of the display member 31 while being brought into contact with the display member 31. However, the above protection film is different from the protection member 1.

As described above, there is a gap between the protection member 1 and the display member 31. Therefore, light is reflected at the interface between each of the members and the gap, with the result that it is likely to increase the amount of glare by external light reflection at the time of outdoor use.

Figure 7:
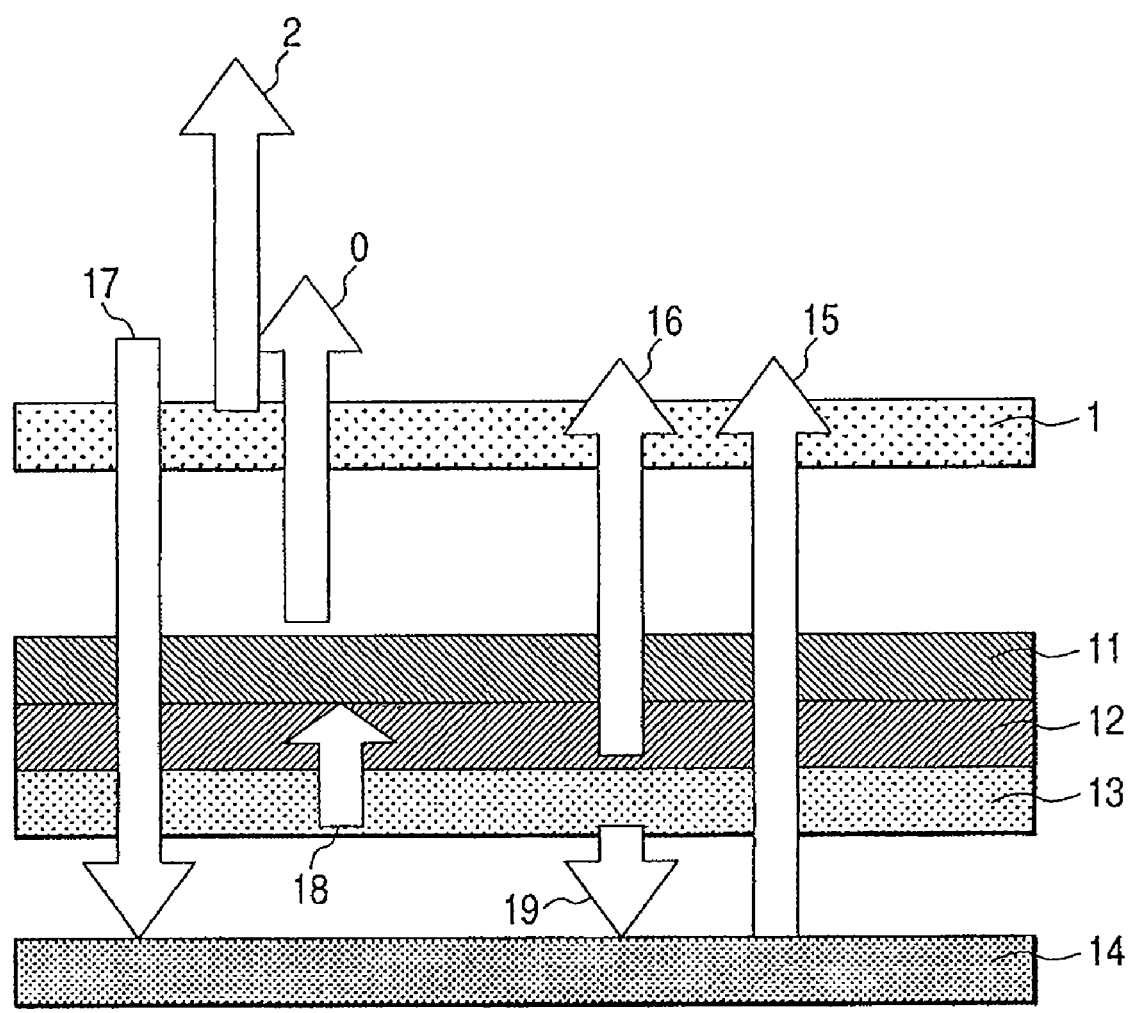
FIG. 7 is an explanatory view showing reflected light at an interface between a gap and each layer adjacent to the gap.

Next, light reflected at an interface between a gap and a layer adjacent thereto will be described with reference to FIG. 7. In FIG. 7, the phase member 21 and the polarizing member 22 are not formed on the protection member 1 unlike the case of the display apparatus according to this embodiment. For convenience of explanation with respect to light, FIG. 7 shows a state where there is a gap between the light-emitting layer 13 and the reflection layer 14. However, a gap is absent and a contact state is present.

In FIG. 7, the polarizing layer 11, the phase member 12, the light-emitting layer 13 and the reflection layer 14 are formed to construct an integrated display member. The protection member 1 is provided over the polarizing layer 11 and separated with a gap therefrom. In such the structure, the light 17 incident on the display member from the outside is reflected on the surface of the polarizing layer 11 and further reflected as light 2 on the surface of the protection member 1. Therefore, when the protection member 1 is separated from the polarizing layer 11 with a gap therebetween, the light from the outside is reflected as the light 2 even on the surface of the protection member 1, so that it is likely to increase a glare phenomenon.

According to the display apparatus of this embodiment, in order to protect the display member 31, the translucent protection member 1 is provided with a gap therebetween so as to cover the light extraction side thereof. The phase member and the polarizing member are formed on the protection member 1. Therefore, light beams reflected at the interface between the display member 31 and the gap, at the interface between the protection member 1 and the gap, and on the reflection electrodes 24 of the organic EL devices included in the display member 31 are blocked by the phase member 21 and the polarizing member 22. As a result, occurrence of the external glare phenomenon which is visually recognizable at the time of use can be reduced to improve the display quality of the display member 31.

Described above is the top-emission type display apparatus in which the light emitted from the organic EL light-emitting portion is extracted from the side opposed to the substrate. According to the present invention, however, a bottom-emission type display apparatus may be used in which the light emitted from the organic EL light-emitting portion is extracted from the substrate side.

Further, the TFT element is used to switch each of the organic EL light-emitting portions. However, even when passive driving using simple matrix wirings is used, the same effect is obtained by the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-360026, filed Dec. 14, 2005, and Japanese Patent Application No. 2006-274574, filed Oct. 6, 2006, which are hereby incorporated by reference herein in their entirety.

What is claimed is:

1. A display apparatus comprising:
    a display member including an organic EL light-emitting portion having a pair of electrodes and an organic compound layer provided between the pair of electrodes, and
    a casing for housing the display member,
    wherein a protection member is provided to the casing and is separated from the display member, and
    wherein a phase member and a polarizing member are formed on the protection member such that the polarizing member is located closer to a light extraction side than the phase member.

2. A display apparatus according to claim 1, wherein the phase member and the polarizing member are formed on the light extraction side of the protection member.

3. A display apparatus according to claim 1, wherein the phase member and the polarizing member are formed on a side of the display member of the protection member.

4. A display apparatus according to claim 1, wherein the polarizing member is formed on the light extraction side of the protection member, and the phase member is formed on a side of the display member of the protection member.

5. A display apparatus according to claim 3, wherein the polarizing member is formed on the protection member through an adhesive member, and the adhesive member has a refractive index of a value between a refractive index of the polarizing member and a refractive index of the protection member.

6. A display apparatus according to claim 1, wherein a protection film is provided between the protection member and the display member.

7. An image capturing apparatus according to claim 1, wherein a protection film is provided between the protection member and the display member.

8. An image capturing apparatus comprising:
   a display member including an organic EL light-emitting portion having a pair of electrodes and an organic compound layer provided between the pair of electrodes,
   an image capturing means, and
   a casing for housing the display member and the image capturing means,
   wherein a protection member is provided to the casing and is separated from the display member, and
   wherein a phase member and a polarizing member are formed on the protection member such that the polarizing member is located closer to a light extraction side than the phase member.

* * * * *